(12) United States Patent
Watanabe et al.

(10) Patent No.: US 10,952,320 B2
(45) Date of Patent: Mar. 16, 2021

(54) PRINTED WIRING BOARD AND METHOD FOR MANUFACTURING SAME

(71) Applicant: KYOCERA Corporation, Kyoto (JP)

(72) Inventors: Tadashi Watanabe, Nyuzen-machi (JP); Masakazu Nakamura, Kurobe (JP); Hiroshi Omodera, Uozu (JP); Tomoko Oyama, Nyuzen-machi (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 16/087,975

(22) PCT Filed: Mar. 23, 2017

(86) PCT No.: PCT/JP2017/011693
§ 371 (c)(1),
(2) Date: Sep. 24, 2018

(87) PCT Pub. No.: WO2017/164300
PCT Pub. Date: Sep. 28, 2017

(65) Prior Publication Data
US 2019/0098755 A1    Mar. 28, 2019

(30) Foreign Application Priority Data

Mar. 24, 2016  (JP) .............................. JP2016-060655

(51) Int. Cl.
*H05K 1/11*     (2006.01)
*H05K 1/03*     (2006.01)
(Continued)

(52) U.S. Cl.
CPC ............... *H05K 1/115* (2013.01); *H05K 1/03* (2013.01); *H05K 1/036* (2013.01); *H05K 3/38* (2013.01);
(Continued)

(58) Field of Classification Search
CPC ......... H05K 2201/09627; H05K 1/036; H05K 1/03; H05K 1/0306; H05K 1/0313;
(Continued)

(56) References Cited

U.S. PATENT DOCUMENTS 6,329,610 B1 * 12/2001 Takubo ............. H01L 23/49827
174/255
6,362,438 B1 *  3/2002 Chong .............. H01L 23/49827
174/262
(Continued)

FOREIGN PATENT DOCUMENTS

EP        2312924 A1    4/2011
JP      2004-172329 A   6/2004
(Continued)

OTHER PUBLICATIONS

Machine Translation of Taguchi JP2014045130A (Year: 2014).*
Drawings from of Taguchi JP2014045130A (Year: 2014).*

*Primary Examiner* — Roshn K Varghese
(74) *Attorney, Agent, or Firm* — Volpe Koenig

(57) ABSTRACT

A printed wiring board in the present disclosure includes a core layer, a first buildup layer, a second buildup layer, and a through hole. The core layer has a conductor circuit located on a surface of an insulator. The first buildup layer containing a first resin is laminated on a surface of the core layer. The second buildup layer containing a second resin is laminated on a surface of the first buildup layer. The through hole extends through the core layer, the first buildup layer, and the second buildup layer. The first resin and the second resin are different from each other. The second buildup layer includes a plurality of filled vias filled with a conductor which are located around a circumference of an opening of the through hole.

17 Claims, 6 Drawing Sheets

(51) Int. Cl.
*H05K 3/46* (2006.01)
*H05K 3/38* (2006.01)
*H05K 3/42* (2006.01)
*H05K 3/00* (2006.01)
*H05K 3/02* (2006.01)

(52) U.S. Cl.
CPC ............ *H05K 3/423* (2013.01); *H05K 3/429* (2013.01); *H05K 3/46* (2013.01); *H05K 3/4652* (2013.01); *H05K 3/0055* (2013.01); *H05K 3/027* (2013.01); *H05K 2201/0195* (2013.01); *H05K 2201/068* (2013.01); *H05K 2201/09627* (2013.01); *H05K 2203/0723* (2013.01)

(58) Field of Classification Search
CPC .... H05K 1/032; H05K 1/0353; H05K 1/0366; H05K 1/0373; H05K 2201/09636; H05K 2201/09618; H05K 2201/09409; H05K 1/115; H05K 1/116; H05K 2201/09418; H05K 2201/09427; H05K 3/4602; H05K 3/4644
USPC .................. 174/262, 264, 265, 266
See application file for complete search history.

(56) References Cited

U.S. PATENT DOCUMENTS

| | | | | |
|---|---|---|---|---|
| 7,319,197 B2* | 1/2008 | Oggioni | ............ | H01L 23/49827 174/262 |
| 7,408,120 B2* | 8/2008 | Kim | ............ | H05K 1/115 174/260 |
| 7,602,062 B1* | 10/2009 | Wang | ............ | H01L 23/145 257/737 |
| 8,072,052 B2* | 12/2011 | Ko | ............ | H01L 21/4846 257/668 |
| 2005/0230813 A1* | 10/2005 | Nakamura | ............ | H05K 1/0222 257/698 |
| 2005/0284655 A1* | 12/2005 | Hsu | ............ | H05K 3/4602 174/255 |
| 2006/0131611 A1* | 6/2006 | Kaluzni | ............ | H01L 23/49827 257/206 |
| 2007/0029108 A1* | 2/2007 | Nakao | ............ | B23K 1/085 174/260 |
| 2007/0096328 A1* | 5/2007 | Takahashi | ............ | H05K 1/115 257/774 |
| 2008/0093112 A1* | 4/2008 | Kushta | ............ | H01P 1/2039 174/260 |
| 2008/0218985 A1* | 9/2008 | Takeda | ............ | H05K 1/0222 361/768 |
| 2008/0237884 A1* | 10/2008 | Hsu | ............ | H01L 23/498 257/774 |
| 2008/0289866 A1* | 11/2008 | Yuri | ............ | H01L 23/49822 174/260 |
| 2010/0072632 A1 | 3/2010 | Yu et al. | | |
| 2010/0282503 A1* | 11/2010 | Kushta | ............ | H05K 1/0251 174/266 |
| 2013/0098669 A1 | 4/2013 | Yoshimura | | |
| 2013/0169305 A1 | 7/2013 | Taguchi et al. | | |
| 2013/0221518 A1* | 8/2013 | Ishida | ............ | H05K 1/0298 257/737 |
| 2013/0222003 A1* | 8/2013 | Taguchi | ............ | G01R 1/07342 324/754.11 |
| 2013/0240258 A1 | 9/2013 | Ishida et al. | | |
| 2015/0122530 A1* | 5/2015 | Katsuda | ............ | H05K 3/4688 174/251 |
| 2016/0374199 A1* | 12/2016 | Kondo | ............ | H01R 24/50 |

FOREIGN PATENT DOCUMENTS

| | | |
|---|---|---|
| JP | 2005-142553 A | 6/2005 |
| JP | 2013-089902 A | 5/2013 |
| JP | 2013-197245 A | 9/2013 |
| JP | 2014045130 A * | 3/2014 |

* cited by examiner

PRINTED WIRING BOARD AND METHOD FOR MANUFACTURING SAME

TECHNICAL FIELD

The present disclosure relates to a printed wiring board having a hybrid structure using two or more kinds of insulating materials having different physical properties, such as electrical properties, mechanical properties, and workability. The present disclosure also relates to a method of manufacturing the printed wiring board.

BACKGROUND ART

A hybrid structure substrate using two or more kinds of insulating materials having different physical properties, such as electrical properties, mechanical properties, and workability, has conventionally been manufactured by split manufacturing of individual functional substrates, followed by sticking them together with adhesive. Because this method includes a complicated process, a method of manufacturing a hybrid structure substrate by integral molding with the use of two or more kinds of insulating materials having different physical properties has also recently been employed as a simpler method.

The hybrid structure substrate employs the two or more kinds of insulating materials having the different physical properties. Therefore, when the hybrid structure substrate is manufactured by integral molding, the individual insulating materials behave differently during a cooling/heating cycle due to, for example, a difference in thermal expansion coefficient between the insulating materials. This causes an increase in stress on a through-hole corner part and thereby causes corner cracks, resulting in degraded through-hole connection reliability. Regarding this phenomenon, for example, Patent Document 1 describes that a through-hole via is less susceptible to cracking by eliminating any difference in physical property value between a double structure through-hole via and a single structure through-hole via in order to avoid stress concentration on one of the through-hole vias.

RELATED ART DOCUMENT

Patent Document

Patent Document 1: Japanese Unexamined Patent Publication No. 2013-89902

SUMMARY

A printed wiring board in the present disclosure includes a core layer, a first buildup layer, a second buildup layer, and a through hole. The core layer has a conductor circuit located on a surface of an insulator. The first buildup layer containing a first resin is laminated on a surface of the core layer. The second buildup layer containing a second resin is laminated on a surface of the first buildup layer. The through hole extends through the core layer, the first buildup layer, and the second buildup layer. The first resin and the second resin are different from each other. The second buildup layer includes a plurality of filled vias filled with a conductor which are located around a circumference of an opening of the through hole.

A method of manufacturing a printed wiring board in the present disclosure includes: obtaining a core layer by forming a conductor circuit on a surface of an insulator; laminating at least one first buildup layer containing a first resin on at least one surface of the core layer; laminating a second buildup layer containing a second resin on a surface of the first buildup layer; forming a through hole extending through the core layer and the first and second buildup layers; and forming a plurality of filled vias filled with a conductor around an opening of the through hole in the second buildup layer.

EMBODIMENTS

Figure 1A:
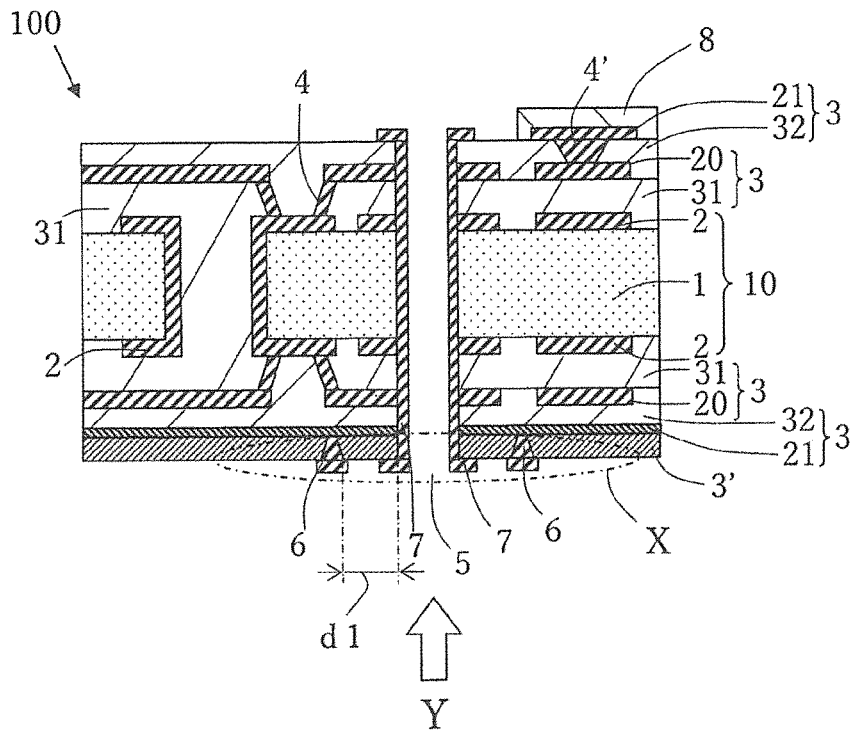
FIG. 1(a) is a sectional view of a printed wiring board in one of embodiments of the present disclosure.

A printed wiring board in one of embodiments of the present disclosure is described below with reference to FIGS. 1(a) and 1(b). As illustrated in FIG. 1(a), the printed wiring board 100 includes a core layer 10, first buildup layers 3 respectively laminated on both upper and lower surfaces of the core layer 10, a second buildup layer 3' laminated on a surface of the first buildup layer 3 located on a lower surface side of the core layer 10, and a through hole 5.

The core layer 10 includes an insulator 1 and conductor circuits 2 respectively located on both upper and lower surfaces of the insulator 1. No particular limit is imposed on the insulator 1 as far as being composed of a material having insulating properties. Examples of the material having insulating properties include organic resins, such as epoxy resin, bismaleimide-triazine resin, and polyimide resin. These organic resins may be used by mixing together two or more kinds thereof.

When an organic resin is used as the insulator 1, it is effective to add a reinforcing material to the organic resin. Examples of the reinforcing material include insulating fabric materials, such as glass fiber, glass nonwoven fabric, aramid nonwoven fabric, aramid fiber, and polyester fiber. Of these reinforcing materials, glass materials, such as glass fiber, are more effective. Two or more kinds of reinforcing materials may be used together. Alternatively, the insulator 1 may contain an inorganic filling material, such as silica, barium sulfate, talc, clay, glass, calcium carbonate, and titanium oxide. The insulator 1 may have a monolayer structure or a multilayer structure.

The conductor circuit 2 is located on the surface of the insulator 1. The conductor circuit 2 only needs to be composed of a conductive material. Examples of the conductive material include metals and conductive resins. Of these conductive materials, copper is effective in terms of workability, such as etching. The conductor circuit 2 can be formed, such as chemical copper plating (electroless copper plating) and copper electroplating, a copper foil, and by carrying out copper plating on the copper foil. Alternatively, the conductor circuit 2 may be formed by forming a hole part in the insulator 1 by laser processing, followed by plating process on the hole part.

The first buildup layers 3 are respectively laminated on both upper and lower surfaces of the core layer 10 including the insulator 1 and the conductor circuit 2. The two first buildup layers 3 are laminated on each of the upper and lower surfaces of the core layer 10 in the printed wiring board 100 illustrated in FIG. 1(*a*). Each of the first buildup layers 3 includes insulating resin layers 31 and 32, and conductor circuits 20 and respectively located on surfaces of the insulating resin layers 31 and 32. The insulating resin layers 31 and 32 are usually made from the same insulating resin. Examples of a first resin constituting the insulating resin layers 31 and 32 include epoxy resin, bismaleimide-triazine resin, and polyimide resin. It is effective that the first resin is identical to the insulating resin constituting the insulator 1 included in the core layer 10. Similarly to the insulator 1, it is also effective to add the reinforcing material as described above to the first resin.

The insulating resin layer 31 includes a via 4 to be electrically connected to the conductor circuit 2 of the core layer 10. The via 4 is formable by adhering or loading a conductor material into the hole part. The insulating resin layer 32 includes a via 4' to be electrically connected to the conductor circuit 20 located on a surface of the insulating resin layer 31. The via 4' is formable by adhering or loading a conductor material into the hole part. As illustrated in FIG. 1, a solder resist layer 8 may be disposed as necessary in order to protect the via 4' and a wiring pattern not illustrated. No limit is imposed on the number and position of the vias 4 and 4', and both are suitably settable according to, for example, the size of the printed wiring board and the scale of wiring.

A second buildup layer 3' is located on a surface of the first buildup layer 3 located on a lower surface side of the core layer 10. The second buildup layer 3' is composed of a resin (second resin) different from that of the first buildup layer 3. The second resin only needs to be different from the first resin. For example, a resin having low dielectricity is suitably selectable according to desired properties. Examples of the second resin include liquid crystal polymer (LCP), fluorine resin, polyphenylene ether (PPE) resin, and polyphenylene oxide (PPO) resin. The second resin usually has a greater thermal expansion coefficient than the first resin.

The through hole 5 extends through upper and lower surfaces of the printed wiring board 100 by going through the core layer 10, the first buildup layer 3, and the second buildup layer 3'. A conductor layer 7 formed by metal plating, such as copper plating, is disposed on an inner wall surface and around a circumference of the opening of the through hole 5. The conductor layer 7 is designed to connect to a wiring pattern (shown in FIG. 5(*b*) as the portions of the conductor layer 7 on the top and bottom surfaces of the printed wiring board 100) on the upper and lower surfaces of the printed wiring board 100. Taking into consideration that a fine pattern is formed by subtractive method, it is effective to design so that the conductor layer 7 located on the inner wall surface and around the circumference of the opening of the through hole 5 has a smaller thickness. Specifically, it is more effective to design so that the conductor layer 7 located on the inner wall surface and around the circumference of the opening of the through hole 5 has a thickness of approximately 15-25 μm.

A plurality of filled vias 6 are arranged around the circumference of the opening of the through hole 5 in the second buildup layer 3' in the printed wiring board 100 illustrated in FIG. 1(*a*). The filled vias 6 operate like a rivet and function to fix, namely, push the second buildup layer 3' against a side of the core layer 10. Therefore, even when the printing wiring board 100 is exposed to a high-temperature environment, for example, the second resin having the greater thermal expansion coefficient is less susceptible to thermal expansion.

Consequently, even when the conductor layer 7 located on the inner wall surface and around the circumference of the opening of the through hole 5 has a small thickness, the conductor layer is less prone to corner cracking. The filled vias 6 are electrically independent and not designed to connect to, for example, the wiring pattern (not illustrated).

No particular limit is imposed on the conductor being loaded in the filled vias 6. For example, a conductor having a smaller thermal expansion coefficient than the second resin is effective. Examples of the conductor include copper, aluminum, gold, silver, cobalt, iron, and palladium. However, it is effective to use copper as the conductor in terms of cost performance and in order to avoid contamination on a copper surface mainly used for forming the through hole 5 and the wiring pattern. No limit is imposed on a diameter of the opening of the filled vias 6. For example, a diameter of an opening of each of the filled vias 6 is smaller than a diameter of the opening of the through hole 5. Although depending on the size of the printed wiring board 100, the diameter of the opening of the filled via 6 is approximately 20-40% of the diameter of the opening of the through hole 5.

It is effective to arrange the filled vias 6 so that a distance d1 between a wall surface of the through hole 5 and a wall surface of each of the filled vias 6 is constant as illustrated in FIG. 1(*b*). Utility as the rivet can be further enhanced when the filled vias 6 are arranged so that the distance d1 is constant, namely, the filled vias 6 are arranged on an identical circumference around the through hole 5. This makes it possible to more efficiently reduce the thermal expansion of the second resin. Eight filled vias 6 are formed for the single through hole 5 in FIG. 1(*b*). However, two or more, or alternatively three or more filled vias 6 are sufficient to reduce the thermal expansion of the second resin.

No particular limit is imposed on the distance d1 between the wall surface of the through hole 5 and the wall surfaces of the filled vias 6. It is effective to arrange the through hole 5 and the filled vias 6 so that the distance d1 is at least 0.3 mm. By the arrangement to ensure that the distance d1 is at least 0.3 mm, the utility as the rivet can be more enhanced to more efficiently reduce the thermal expansion of the second resin. An upper limit of the distance d1 is approximately 0.5 mm although depending on space existing in a circumferential part of the through hole 5 and on the kinds of the first resin and the second resin.

No particular limit is imposed on a distance d2 between wall surfaces of the filled vias 6 adjacent to each other. It is effective to arrange so that the distance d2 between the filled vias 6 and 6 adjacent to each other is at least 0.3 mm. By the arrangement to ensure that the distance d2 is at least 0.3 mm, the utility as the rivet can further be enhanced to more efficiently reduce the thermal expansion of the second resin. An upper limit of the distance d2 is approximately 0.5 mm although depending on space existing in the circumferential part of the through hole 5 and on the kinds of the first resin and the second resin.

A method of manufacturing a printed wiring board in one of embodiments of the present disclosure includes the following steps (I) to (V).

(I) obtaining a core layer by forming a conductor circuit on a surface of an insulator;

(II) laminating at least one first buildup layer containing a first resin on at least one surface of the core layer;

(III) laminating a second buildup layer containing a second resin on a surface of the first buildup layer;

(IV) forming a through hole extending through the core layer and the first and second buildup layers; and (V) forming a plurality of filled vias filled with a conductor around a circumference of an opening of the through hole in the second buildup layer.

The method of manufacturing a printed wiring board in the embodiment of the present disclosure is described below with reference to FIGS. 2(a) to 2(d) and FIGS. 3(e) and 3(f).

Figure 2A:
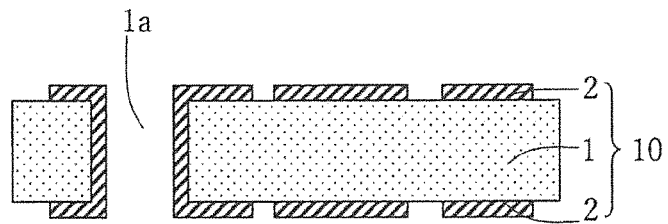
FIGS. 2(a) to 2(d) are process charts illustrating a method of manufacturing a printed wiring board in one of embodiments of the present disclosure.

As illustrated in FIG. 2(a), the core layer 10 is prepared in which the conductor circuit 2 is formed on a surface of the insulator 1. The core layer 10 is obtainable, for example, in the following manner. A dry film (not illustrated), which is an etching resist, is stuck under vacuum to the insulator 1 having a conductor (copper foil) formed on a surface thereof, followed by exposure and development. Thereafter, the dry film is released by etching to form the conductor circuit 2 on the surface of the insulator 1. A hole part 1a having a conductor layer deposited on an inner wall surface thereof is obtainable in the following manner. A hole is formed by a drilling process or laser processing of the insulator 1 having a conductor (plating, a copper foil, and plating on the copper foil) formed on a surface thereof, and by depositing a conductor (copper or the like) on an inner wall surface of the hole, for example, by plating. Examples of laser beam used for the laser processing include $CO_2$ laser and UV-YAG laser.

Figure 2B:
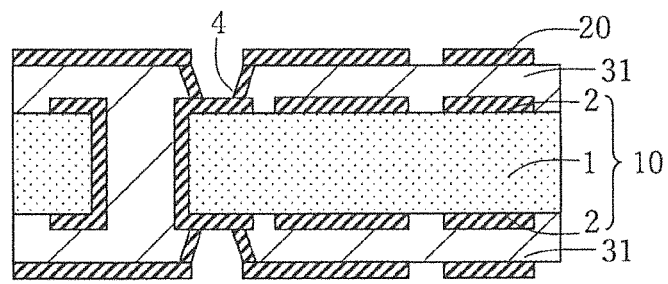

Subsequently, as illustrated in FIG. 2(b), an insulating resin layer 31 containing a first resin is laminated on both upper and lower surfaces of the core layer 10. The first resin is as described above, and the description thereof is omitted here. A conductor circuit 20 is also formed on a surface of the insulating resin layer 31. The conductor circuit 20 may be formed, for example, by the method of forming the conductor circuit 2.

A via 4 to be electrically connected to the conductor circuit 2 of the core layer 10 is formed in the insulating resin layer 31. The via 4 is obtainable, for example, by forming a hole by the laser processing of the insulating resin layer 31, and then by depositing a conductor (copper or the like) on an inner wall surface of the hole by plating. Examples of the plating include copper plating, such as chemical copper plating (electroless copper plating) and copper electroplating.

Figure 2C:
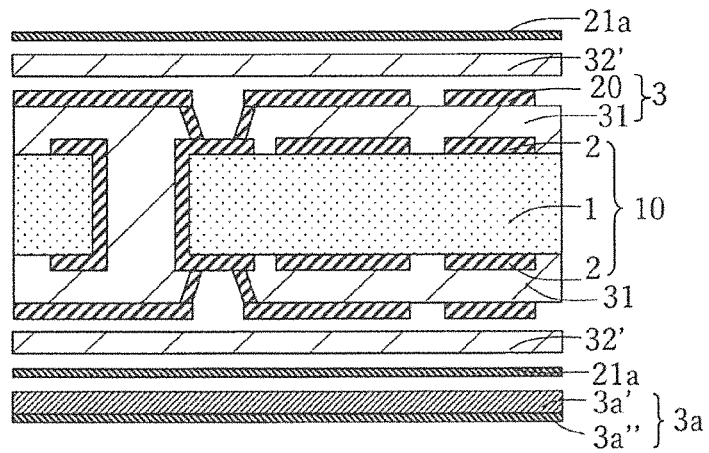

Subsequently, as illustrated in FIG. 2(c), a first prepreg 32' and a copper foil 21a are mounted (laid up) on the surface of each of the insulating resin layers 31 respectively formed on the upper and lower surfaces of the core layer 10. The first prepreg 32' becomes an insulating layer 32 after hot pressing. The insulating resin layer 31 and the insulating resin layer 32 are usually made from the same insulating resin.

After the first prepreg 32' and the copper foil 21a are mounted on the lower surface side of the core layer 10, a resin-attached copper foil 3a is laid up additionally. The resin-attached copper foil 3a is obtainable by depositing a resin (half cured resin) 3a' different from the resin of the first prepreg 32' on one surface of a copper foil 3a", followed by integration. The resin (half cured resin) 3a' becomes a second buildup layer 3' after hot pressing. The second buildup layer 3' is as described above, and the description thereof is omitted here. For example, "R-F10" (manufactured by Panasonic Corporation) is commercially available as the resin-attached copper foil 3a.

Figure 2D:
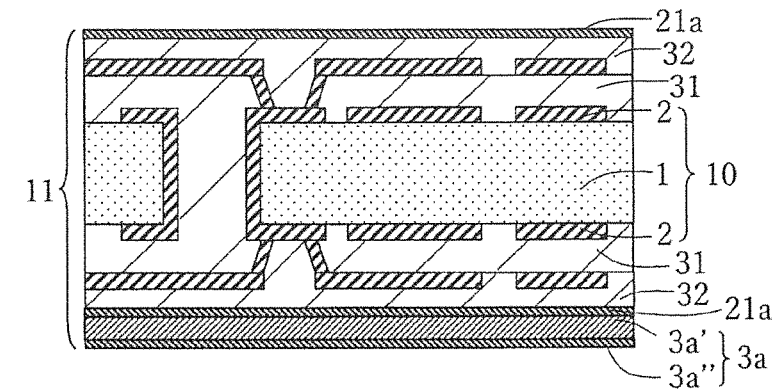

Subsequently, a laminate 11 whose individual layers are laminated on both upper and lower surfaces of the core layer 10 as illustrated in FIG. 2(d) is obtainable by hot pressing of the core layer 10 whose individual layers are laid up. Here, melted resin contained in the first prepreg 32' is loaded into the via 4.

Figure 3E:
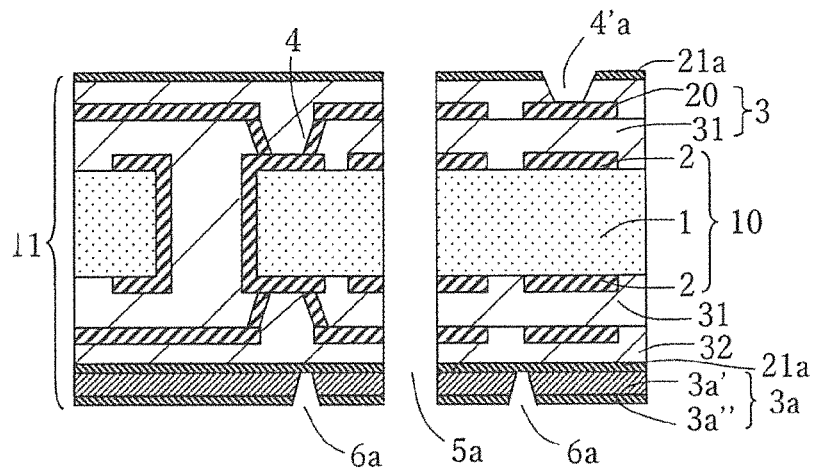
FIGS. 3(e) and 3(f) are process charts illustrating the method of manufacturing a printed wiring board in the embodiment of the present disclosure.
Figure 3F:
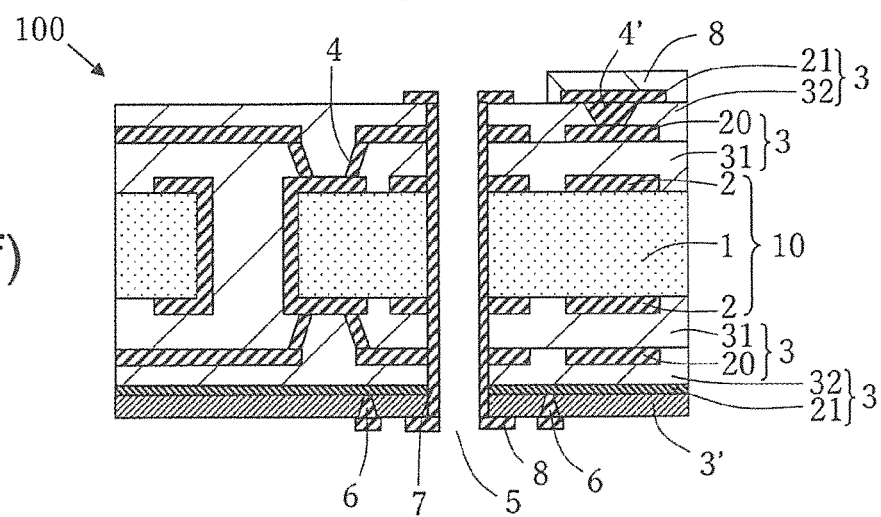

Subsequently, a hole part for forming through hole 5a is formed so as to extend through the upper and lower surfaces of the laminate 11 by drilling process or the laser processing as illustrated in FIG. 3(e). Here, a hole part 4'a for forming a via 4' to be electrically connected to the conductor circuit 20 of the insulating resin layer 31 is formed in the insulating resin layer 32 by the laser processing. Resin residue (not illustrated) during opening may remain on a circumference and an inner wall surface of an opening of each of the hole part for forming through hole 5a and the hole part 4'a. In that case, the residue is removed by desmear treatment.

Then, a hole part 6a for forming a filled via 6 is formed on the circumference of the opening of the hole part for forming through hole 5a in the resin-attached copper foil 3a, for example, by the laser processing. A plurality of the hole parts 6a are arranged around the circumference of the opening of the hole part for forming through hole 5a. Resin residue (not illustrated) during opening may remain on a circumference and an inner wall surface of an opening of each of the hole parts 6a. In that case, the residue is removed by desmear treatment.

Subsequently, as in the case of the via 4, a conductor layer 7 is formed by depositing a conductor (copper or the like) on the inner wall surface and on the circumference of the opening of the hole part for forming through hole 5a by plating. Then, the via 4' and the filled vias 6 are formed by loading a conductor (copper or the like) into the hole part 4'a for forming the via 4' and the hole parts 6a for forming the filled vias 6 by plating. Examples of the plating include copper plating, such as copper electroplating.

After the plating process, a dry film is stuck under vacuum to the surface of the laminate 11. Thereafter, exposure and development are carried out, and the dry film is removed which is located at positions other than forming positions of the hole part 4'a for forming the via 4', the hole parts 6a for forming the filled vias 6, and the hole part for forming through hole 5a. After etching the conductor, the dry film located at forming positions of a conductor circuit and the like is released. Thus, it is possible to obtain the via 4' electrically connected to the conductor circuit 20, and the through hole 5 and the filled vias 6 which extend through the upper and lower surfaces of the laminate 11 and have the conductor layer 7 formed on the inner wall surface and the circumference of the opening. Finally, a solder resist layer 8 is formed at a desired portion, and surface processing is carried out to obtain the printed wiring board 100 illustrated in FIG. 3(f).

Figure 4A:
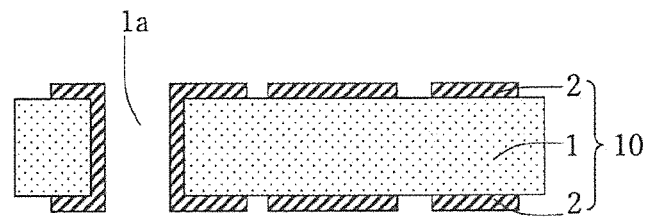
FIGS. 4(a) to 4(d) are process charts illustrating a method of manufacturing a printed wiring board in other embodiment of the present disclosure.
Figure 4B:
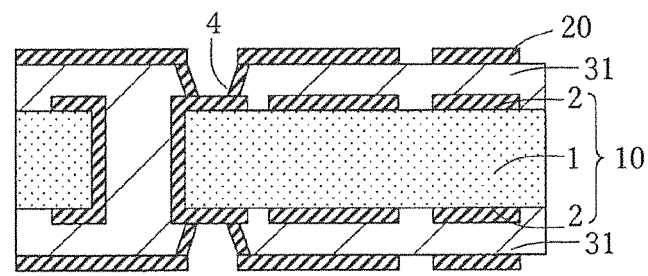

In the description of the manufacturing method in the present embodiment, the resin-attached copper foil 3a is used as the material of the second buildup layer 3'. Instead of the resin-attached copper foil 3a, only the resin (half cured resin) 3a' may be used as the material of the second buildup layer 3'. Alternatively, instead of the resin-attached copper foil 3a, a double-layer substrate may be used as the material of the second buildup layer 3'. An embodiment using the double-layer substrate is described below with reference to FIGS. 4(a) to 4(d) and FIGS. 5(e) and 5(f). FIGS. 4(a) and 4(b) are the same as FIGS. 2(a) and 2(b), and the description thereof is omitted here.

Figure 4C:
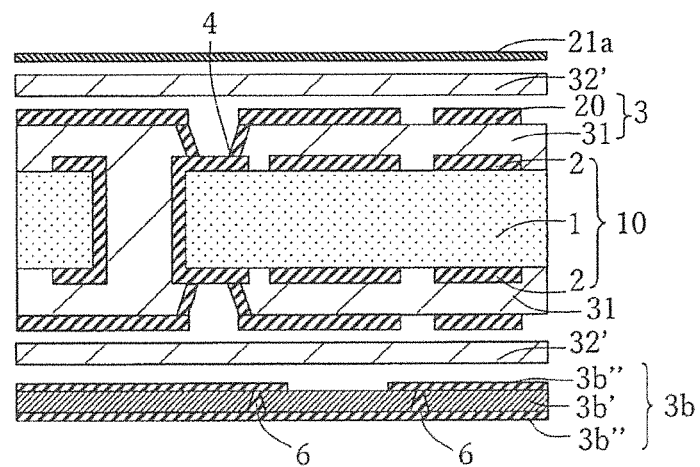

As illustrated in FIG. 4(c), a first prepreg 32' and a copper foil 21a are laid up on a surface of an insulating resin layer 31 formed on an upper surface side of a core layer 10. The first prepreg 32' and a double-layer substrate 3b are laid up on a surface of an insulating resin layer 31 formed on a lower surface side of the core layer 10. The first prepreg 32' becomes an insulating resin layer 32 after hot pressing. The insulating resin layer 31 and the insulating resin layer 32 are usually made from the same insulating resin.

The double-layer substrate 3b includes an insulator 3b' and conductor layers 3b" and 3b" respectively formed on both upper and lower surfaces of the insulator 3b'. The conductor layer 3b" on one of the surfaces is a desired conductor circuit. The insulator 3b' becomes a second buildup layer 3' after hot pressing. The double-layer substrate 3b needs to be previously subjected to the following processing before being laid up. For example, "RO3003" (manufactured by Rogers Corporation), "NPC-F275" (manufactured by NIPPON PILLAR PACKING Co., LTD), "R-F705T" (manufactured by Panasonic Corporation), and "R-5785" (manufactured by Panasonic Corporation) are commercially available as a material constituting the double layer substrate 3b.

Firstly, a hole part for forming a filled via 6 is formed in the double-layer substrate 3b, for example, by the laser processing. A plurality of the hole parts are arranged around a circumference of a forming position of a through hole 5, namely, a circumference of an opening of the through hole 5. Resin residue (not illustrated) during opening may remain around the circumference and on an inner wall surface of the opening of each of the hole parts. In that case, the residue is removed by desmear treatment. Thereafter, the filled vias 6 are formed by loading a conductor (copper or the like) into the hole parts by the plating. The filled vias 6 need not be formed at this stage. For example, the filled vias 6 may be formed by forming hole parts for forming the filled vias 6 after hot pressing the double-layer substrate 3b, and by loading a conductor into the hole parts, as in the case of FIGS. 3(e) and 3(f) described above.

After forming the filled vias 6, a dry film is stuck under vacuum to both surfaces of the double-layer substrate 3b. Then, exposure and development are carried out so that a desired conductor circuit is formed on one of the surfaces of the double-layer substrate 3b. This results in the double-layer substrate 3b including the plurality of filled vias 6 and the conductor layer 3b" as the desired conductor circuit formed on the one surface. It is effective to ensure that the conductor layers 3b" respectively formed on both upper and lower surfaces of the double-layer substrate 3b have a thickness of 20 μm or less.

Figure 4D:
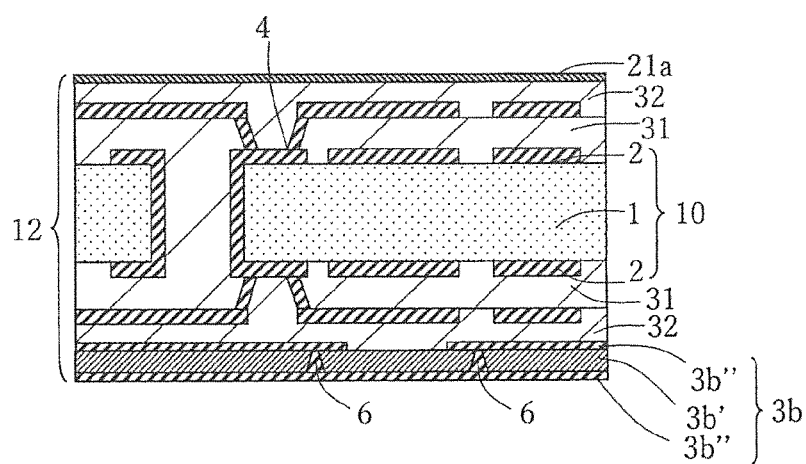

A laminate 12 whose individual layers are laminated on both upper and lower surfaces of the core layer 10 as illustrated in FIG. 4(d) is obtainable by hot pressing the core layer 10 whose individual layers are laid up. Here, melted resin contained in the first prepreg 32' is loaded into the via 4.

Figure 5E:
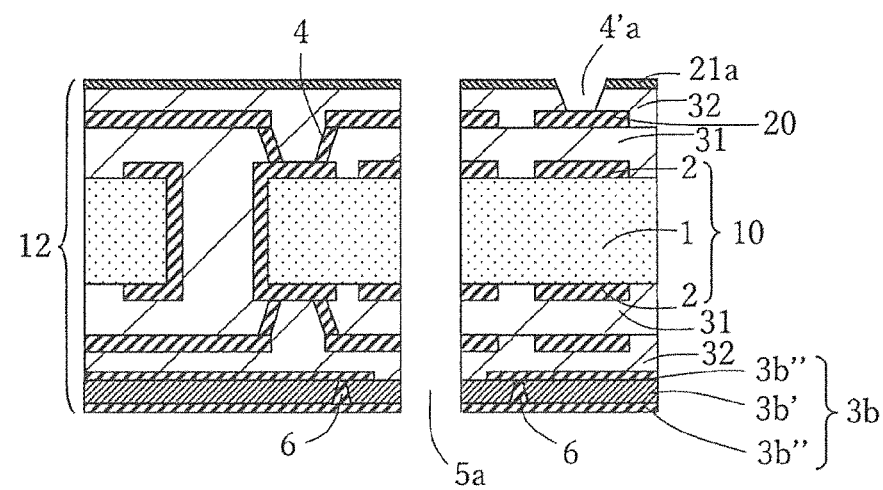
FIGS. 5(e) and 5(f) are process charts illustrating the method of manufacturing a printed wiring board in the other embodiment of the present disclosure.
Figure 5F:
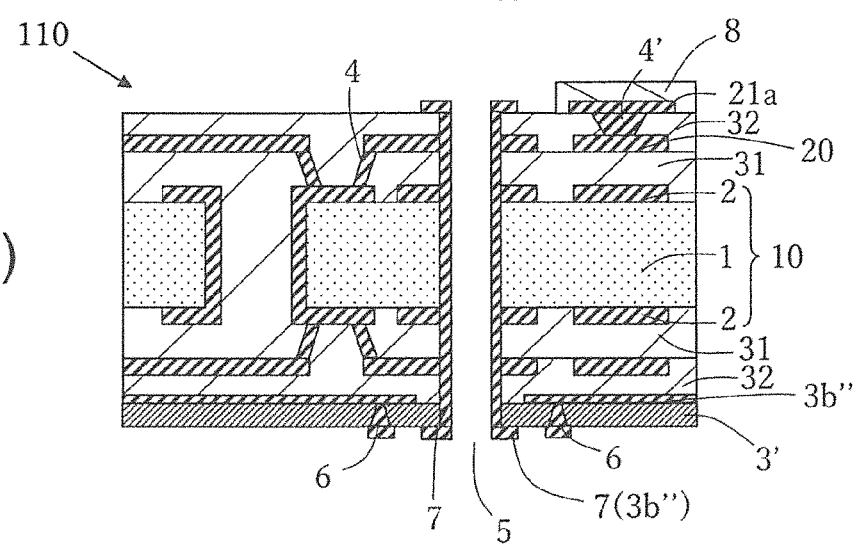
Figure 6:
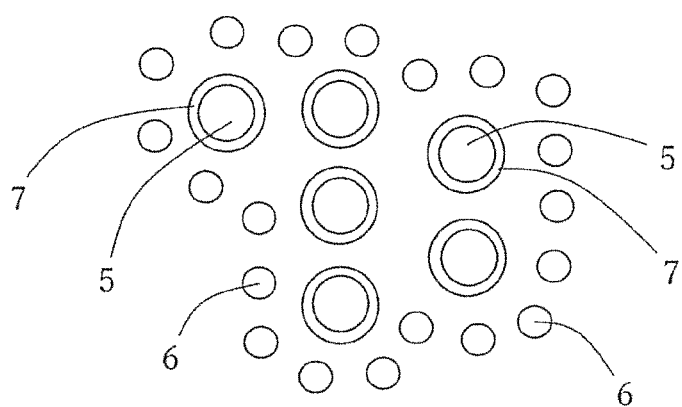
FIG. 6 is an explanatory drawing illustrating an embodiment of a plurality of filled vias arranged around a circumference of an opening of a through hole.

Subsequently, a hole part for forming through hole 5a is formed so as to extend through the upper and lower surfaces of the laminate 12 by drilling process or the laser processing as illustrated in FIG. 5(e). Here, a hole part 4'a for forming a via 4' to be electrically connected to a conductor circuit 20 of the insulating resin layer 31 is formed in the insulating resin layer 32 by the laser processing. Resin residue (not illustrated) during opening may remain on a circumference and an inner wall surface of an opening of each of the hole part for forming through hole 5a and the hole part 4'a. In that case, the residue is removed by desmear treatment.

Subsequently, a conductor layer 7 is formed by depositing a conductor (copper or the like) on the inner wall surface of the hole part for forming through hole 5a by plating. Then, the via 4' is formed by loading a conductor (copper or the like) into the hole part 4' for forming the via 4' by plating. The plating is as described above, and the description thereof is omitted here.

After the plating process, a dry film is stuck under vacuum to the surface of the laminate 12. Thereafter, exposure and development are carried out, and the dry film is removed which is located at positions other than forming positions of the hole part 4'a for forming the via 4' and the hole part for forming through hole 5a. After etching the conductor, the dry film located at forming positions of a conductor circuit 21 and the like is released. Thus, it is possible to obtain the via 4' electrically connected to the conductor circuit 20, and the through hole 5 which extends through the upper and lower surfaces of the laminate 12 and has the conductor layer 7 formed on the inner wall surface and the circumference of the opening. Finally, a solder resist layer 8 is formed at a desired portion, and surface processing is carried out to obtain the printed wiring board 110 illustrated in FIG. 5(f).

With the printed wiring board in the embodiment of the present disclosure, corner cracks are less likely to occur even when the conductor layer formed on the inner wall surface and around the circumference of the opening of the through hole has a small thickness. For example, even when the conductor layer formed on the inner wall surface and around the circumference of the opening of the through hole has a thickness as small as approximately 10 μm, no cracks occurred even by carrying out 300 cycles of a cooling/heating cycle test, specifically, 15 seconds at 260° C. and 20 seconds at 20° C. When a resistance value before the cooling/heating cycle test is compared with a resistance value after the 300 cycles, a resistance change rate was almost unchanged, specifically within 3% from an initial value. The printed wiring board in the embodiment of the present disclosure causes no through hole disconnection, thus leading to improved through-hole connection reliability.

When using a printed wiring board not provided with the filled via 6, cracks occurred after carrying out 100 cycles of the cooling/heating cycle test even when the conductor layer formed on the inner wall surface and around the circumference of the opening of the through hole had a thickness of approximately 25 μm. Resistance values were measured during 300 cycles of the cooling/heating cycle test. The results showed that a resistance change rate was changed approximately 10% from an initial value.

The printed wiring boards of the present disclosure are not limited to the above embodiments, and various improvements can be made within the scope of claims. For example, the second buildup layer 3' is disposed only one surface of the printed wiring boards 100 and 110 in the above embodiments. Alternatively, the second buildup layer 3' may be disposed on both surfaces thereof. In that case, a plurality of filled vias are formed around the circumference of the opening of the through hole 5 in each of both the upper and lower second buildup layers 3'.

Figure 1B:
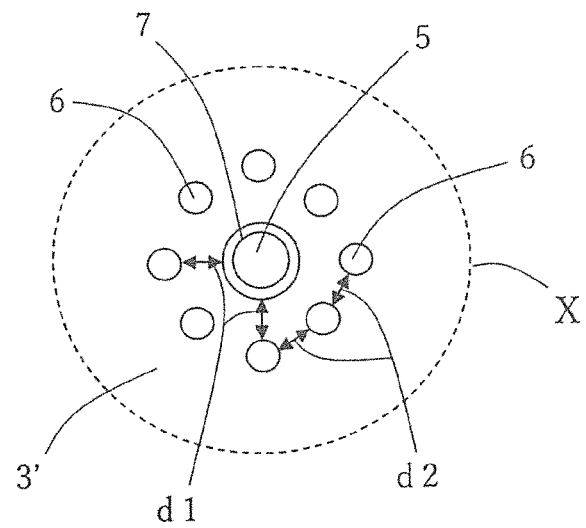
FIG. 1(b) is a plan view of a lowermost part of a second buildup layer when a region X surrounded by a broken line in FIG. 1(a) is viewed from an arrow Y direction.

Furthermore, as illustrated in FIG. 1(b), the plurality of filled vias 6 are arranged so as to surround the opening of the single through hole 5 in the above embodiments. Alternatively, when a plurality of through holes 5 are formed in a concentrated manner, the plurality of through holes 5 may be altogether surrounded by the plurality of filled vias 6.

DESCRIPTION OF THE REFERENCE NUMERAL 1 insulator
1a hole part
10 core layer
2, 20, 21 conductor circuit
21a copper foil
3 first buildup layer
31, 32 insulating resin layer
32' first prepreg
3' second prepreg layer
3a resin-attached copper foil
3a' resin (half cured resin)
3a" copper foil
3b double-layer substrate
3b' insulator
3b" conductor layer
4, 4' via
4'a hole part for forming via
5 through hole
5a hole part for forming through hole
6 filled via
6a hole part for forming filled via
7 conductor layer
8 solder resist layer
11, 12 laminate
100, 110 printed wiring board

The invention claimed is:

1. A printed wiring board, comprising: a core layer comprising a conductor circuit located on a surface of an insulator; a first buildup layer containing a first resin which is laminated on a surface of the core layer; a second buildup layer containing a second resin which is laminated on a surface of the first buildup layer; a first conductor layer laminated on the surface of the first buildup layer between the first and second buildup layers; and a through hole extending through the core layer, the first buildup layer, and the second buildup layer, and a second conductor layer extending continuously on an exposed bottom surface of the second buildup layer, on an inner surface of the through hole and on a top surface of the printed wiring board opposite the exposed bottom surface of the second buildup layer, wherein the first resin and the second resin are different from each other, the second buildup layer comprises a plurality of vias which are filled with a conductor and located on an identical circumference equally spaced around an opening of the through hole, and wherein the plurality of vias, which are filled with the conductor, are electrically independent, are directly connected to the first conductor layer, and the filled vias are not electrically connected to the second conductor layer.

2. The printed wiring board according to claim 1, wherein at least two pieces of the filled vias are arranged around the circumference of the opening of the through hole.

3. The printed wiring board according to claim 1, wherein a plurality of the filled vias are arranged on an identical circumference around the through hole.

4. The printed wiring board according to claim 1, wherein a wall surface of the through hole and a wall surface of each of the filled vias are separated by a distance of at least 0.3 mm.

5. The printed wiring board according to claim 1, wherein a distance between wall surfaces of the filled vias adjacent to each other is at least 0.3 mm.

6. The printed wiring board according to claim 1, wherein a resin constituting the insulator of the core layer and the first resin constituting the first buildup layer are identical.

7. The printed wiring board according to claim 1, wherein the first buildup layer is located on both upper and lower surfaces of the core layer, and the second buildup layer located on a surface of the first buildup layer located on one or both of the upper and lower surfaces.

8. The printed wiring board according to claim 1, wherein the second buildup layer is located on a surface of the first buildup layer located on one surface of the core layer.

9. The printed wiring board according to claim 1, wherein the first buildup layer comprises at least one layer containing the first resin.

10. The printed wiring board according to claim 1, wherein the second resin has a greater thermal expansion coefficient than the first resin.

11. The printed wiring board according to claim 1, wherein the conductor of each of the plurality of filled vias is electrically independent from the conductor circuit.

12. The printed wiring board according to claim 1, wherein the plurality of filled vias push the second buildup layer against a side of the core layer.

13. The printed wiring board according to claim 1, wherein the plurality of vias are electrically independent from the through hole and only extend through the second buildup layer.

14. A method of manufacturing a printed wiring board, comprising: obtaining a core layer by forming a conductor circuit on a surface of an insulator; laminating a first buildup layer containing a first resin on at least one surface of the core layer; laminating a first conductor layer on the at least one surface of the first buildup layer, laminating a second buildup layer containing a second resin, different from the first resin, on a surface of the first buildup layer and the first conductor layer; forming a through hole extending through the core layer and the first and second buildup layers; forming a second conductor layer extending continuously on an exposed bottom surface of the second buildup layer, on an inner surface of the through hole and on a top surface of the printed wiring board opposite the exposed bottom surface of the second buildup layer; and forming a plurality of vias which are filled with a conductor and located on an identical circumference equally spaced around an opening of the through hole in the second buildup layer, wherein the plurality of vias, which are filled with the conductor, are electrically independent, are directly connected to the first conductor layer, and are not electrically connected to the second conductor layer.

15. The method of manufacturing a printed wiring board according to claim 14, wherein the second buildup layer is a resin-attached copper foil.

16. The method of manufacturing a printed wiring board according to claim 14, wherein the second buildup layer is a double-layer substrate.

17. The method according to claim 14, wherein the plurality of vias are electrically independent from the through hole and only extend through the second buildup layer.

* * * * *